United States Patent
Verheijen et al.

(10) Patent No.: US 10,500,876 B2
(45) Date of Patent: Dec. 10, 2019

(54) INKJET PRINTING SYSTEM AND METHOD FOR PROCESSING WAFERS

(71) Applicant: MEYER BURGER (NETHERLANDS) B.V., Eindhoven (NL)

(72) Inventors: Johan Verheijen, Eindhoven (NL); Laurentius Hendrikus Adrianus Van Dijk, Eindhoven (NL)

(73) Assignee: MEYER BURGER (NETHERLANDS) B.V., Eindhoven (NL)

( * ) Notice: Subject to any disclaimer, the term of this patent is extended or adjusted under 35 U.S.C. 154(b) by 0 days.

(21) Appl. No.: 15/327,749

(22) PCT Filed: Jul. 21, 2015

(86) PCT No.: PCT/NL2015/050533
§ 371 (c)(1),
(2) Date: Jan. 20, 2017

(87) PCT Pub. No.: WO2016/013934
PCT Pub. Date: Jan. 28, 2016

(65) Prior Publication Data
US 2017/0210148 A1    Jul. 27, 2017

(30) Foreign Application Priority Data
Jul. 22, 2014   (NL) ..................................... 2013237

(51) Int. Cl.
| | | |
|---|---|---|
| H01L 21/68 | (2006.01) | |
| B41J 11/58 | (2006.01) | |
| B41J 2/01 | (2006.01) | |

(52) U.S. Cl.
CPC ........ *B41J 11/58* (2013.01); *B41J 2/01* (2013.01)

(58) Field of Classification Search
CPC ...................................................... B41J 11/58
See application file for complete search history.

(56) References Cited

U.S. PATENT DOCUMENTS

| | | | |
|---|---|---|---|
| 6,436,843 B1 | 8/2002 | Meinhold et al. | |
| 7,611,217 B2 | 11/2009 | Shamoun et al. | |
| 2006/0158474 A1* | 7/2006 | Van Dam | F04B 47/02 347/16 |
| 2007/0070109 A1* | 3/2007 | White | B41J 29/393 347/19 |
| 2007/0169806 A1 | 7/2007 | Fork et al. | |
| 2009/0059198 A1* | 3/2009 | Shibazaki | G03F 7/70775 355/72 |
| 2009/0073511 A1* | 3/2009 | Kinjo | G03F 7/70291 358/497 |
| 2009/0311613 A1* | 12/2009 | Yamada | B82Y 10/00 430/5 |
| 2014/0065735 A1* | 3/2014 | Koshiba | H01L 22/10 438/14 |
| 2014/0209933 A1* | 7/2014 | Kim | C23C 14/042 257/88 |

FOREIGN PATENT DOCUMENTS

| | | |
|---|---|---|
| EP | 1 888 336 A2 | 2/2008 |
| WO | WO 2006/116318 A2 | 11/2006 |
| WO | WO 2011/026880 A1 | 3/2011 |

* cited by examiner

*Primary Examiner* — Austin Murata
(74) *Attorney, Agent, or Firm* — Birch, Stewart, Kolasch & Birch, LLP

(57) ABSTRACT

An inkjet printing system and method for processing wafers in a high volume are disclosed. The inkjet printing system includes a chuck on which a wafer can be placed and an inkjet printing head with at least one nozzle. Each chuck is associated with a single camera. Each chuck includes a 2-dimensional visual reference. An electronic controller assembly is configured to take a single image containing the wafer edge and the 2-dimensional visual reference each instance a wafer has been placed on a chuck. For each image, the position of the chuck relative to the camera and the position of the wafer relative to the camera are determined. Subsequently, the wafer position relative to the chuck is calculated and based on that the firing of the at least one nozzle is timed and the movement of the printing motion assembly is controlled so that the liquid drops are accurately positioned on the wafer.

19 Claims, 3 Drawing Sheets

INKJET PRINTING SYSTEM AND METHOD FOR PROCESSING WAFERS

FIELD

The invention inkjet printing system and method for processing wafers. More particular, the invention relates to a printing system and to a method for processing high volumes of wafers in a short time.

BACKGROUND

U.S. Pat. No. 6,436,843 B1 discloses a method for applying a coating material on a substrate, wherein a print head is disposed over a substrate which is supported by a chuck. A digital signal processor provides control signals for controlling process parameters for dispensing drops of coating material and for controlling the relative position of the print head and the chuck. The manner in which the relative position between the print head and the chuck is determined is not disclosed.

US2007/169806 A1 discloses a print assembly including a print head and a camera having high magnification capabilities mounted in a rigid mount. The rigid mount with the print head and the camera are mounted over a conveyor for supporting wafers. A computer/workstation is coupled to receive and process imaging data from the camera. With this setup the rigid mount carrying the print head and the camera can be calibrated and registered with respect to a wafer which is on the conveyor. The camera having high magnification capabilities is relatively expensive.

WO2011/026880 A1 discloses a system and a method for centering a print track, on a substrate. Firstly, a printing station deposits a first print track and a marker element. Secondly, a second print track is deposited in a second step, which second print track includes a centering interruption which is positioned and centered with respect to the marker element. The known method, which is primarily concerned with aligning subsequently applied screen printing patterns, may include use of an inspection system including a CCD camera. The inspection system may locate the position of certain features of an incoming substrate and may communicate the inspection results to a system controller for analysis of the orientation and position of the substrate to assist in the precise position of the substrate under a printing head prior to processing the substrate.

U.S. Pat. No. 7,611,217 B2 discloses a method and a system for inkjet drop positioning. The known method includes determining an intended deposition location of an ink drop on a substrate. To that end an ink drop is deposited on the substrate using an inkjet printing system. Subsequently, a deposited location of the deposited ink drop on the substrate is located and the deposited location is compared to the intended location. Then, the difference between the deposited location and the intended location is determined and the difference between the deposited location and the intended location is compensated by adjusting a control parameter of the inkjet system.

This method is time consuming because it has to be done for each wafer that has to be processed. In view thereof, the known system is not suited for a high volume inkjet printer system.

EP 1 888 336 discloses an inkjet printing system including a calibration camera and a vision camera assembly and a feducial mark on the calibration camera assembly. The vision camera assembly includes a high resolution camera and a low resolution camera with a greater field than the high resolution camera, typically in the order of 10 mm by 10 mm. With the calibration camera the position errors between the print heads can be determined by looking at the printing heads with the calibration camera. When errors are found, these may be adjusted. Both the vision camera assembly and the calibration camera assembly are able to look at the feducial mark in order to coordinate vision camera assembly and the calibration camera assembly. Once relative positioning between calibration camera assembly and machine vision camera assembly is known, relative positioning between print heads, calibration camera assembly, and machine vision camera assembly may be determined by a computer and may be used for print head and print head carriage adjustment. Further, relative positioning between vision camera assembly and print head carriage frame may be known through the use of common optical strip. This may generally allow a computer to determine relative positioning between substrate and print heads and determine any positioning error therebetween.

In order to accurately determine the position of a wafer relative to a printing head, an expensive dual camera vision assembly including a high resolution and a low resolution camera is necessary as well as a calibration camera assembly. The accuracy and the precision of the known measurement system is determined by the accuracy of the positions of the various cameras. In view thereof, the carriages of the various cameras must be very robust in order to ensure that the relative positions of the cameras of the two systems remain intact. Such robust movable camera carriages are expensive.

SUMMARY

An object of the invention is to provide an inkjet printing system in which the disadvantages of the prior art are alleviated. More particular, it is an object of the invention to provide an inkjet printing system that uses a relatively low cost camera but with which the deposition of the liquid on the wafer can be effected with a positioning variation around theoretically desired positions that remains during the processing of a large number of wafers within the requirements of the printing job at hand even if a high volume of wafers is supplied in a limited amount of time.

To that end, the invention provides an inkjet printing system configured to inkjet patterns of liquid material on wafers that are supplied in a high volume and that each have a wafer edge that extends in at least two different directions, the inkjet printing system including:
  at least one chuck on which a wafer can be placed;
  at least one inkjet printing head that includes at least one nozzle that is configured to discharge liquid when the nozzle is fired by a control signal;
  a printing motion assembly that supports at least one of the at least one chuck and the at least one inkjet printing head so that a two dimensional printing area on the at least one chuck can be covered with liquid discharged by the at least one printing head;
  an electronic controller assembly configured to produce control signals to fire the at least one nozzle and configured to control the printing motion assembly for positioning the at least one printing head relative to the at least one chuck so that the positioning variation with which the liquid is discharged relative to the chuck is less than a first threshold value;
  each chuck of the at least one chuck being associated with a single associated camera that is directed to the associated chuck, each camera having a two dimensional matrix of camera pixels, each pixel having a pixel coordinate;

each chuck including a placement area extending within a boundary;

each chuck including a 2-dimensional visual reference visual reference;

wherein the controller assembly is configured:

to control a said camera that is associated with a said chuck to take a single image each instance a wafer has been placed on that chuck, wherein the image I includes the wafer edge and the 2-dimensional visual reference of the chuck;

to determine, for each image, the position of the chuck relative to the camera by detecting the position of the 2-dimensional visual reference with respect to the camera pixel coordinates; and to determine, for each image, the position of the wafer relative to the camera by detecting the position of the wafer edge of the wafer W with respect to the camera pixel coordinates;

to use these two position determinations to calculate, for each image, the wafer position relative to the 2-dimensional visual reference and thus relative to the chuck with an accuracy of less than a second threshold value and, based on that relative position, subsequently time the firing of the at least one nozzle of the at least one printing head and control the movement of the printing motion assembly so that the liquid discharged by the inkjet printing head is positioned on the wafer with a positioning variation which is less than the sum of the first and the second threshold values.

By virtue of the presence of the 2-dimensional visual reference on the chuck, the relative position between the chuck and the wafer can be determined very accurately by taking a single image of the chuck with the wafer placed thereon with a relatively low cost camera, more particularly a simple CCD-camera. This can be effected by comparing the relative positions of the 2-dimensional visual reference on the chuck and the wafer edges as registered in the image taken by the camera. The support structure of the camera does not have to be robust because the position of the camera relative to the print heads does not play a role in determining the position of the wafer relative to the print head. The positioning variation of the liquid relative to the chuck is, of course, determined by the printing motion assembly that takes care of the relative movement between the chuck and the printing head and must be below a first threshold value. The positioning variation is a quantity of length expressed, for example, in the unit micrometers. This printing motion assembly has to be robust anyway in order to be able to deposit liquid droplets or liquid tracks relative to each other on a wafer with a repeatable precision. With the configuration according to the invention, the determination of the position of the wafer on the chuck can be effected very quickly and with an accuracy that is less than the second threshold, namely by taking a single image after a wafer has been placed on the chuck and some subsequent calculations based on that image. The accuracy is also a quantity of length, for example, expressed in the unit micrometers. Additionally, the determination of the position of the wafer relative to the chuck can be obtained with a camera assembly that is low cost in comparison with the prior art systems. As a consequence, the positioning variation of liquid that has been discharged on the wafer is less than the sum of the first and the second threshold value.

An additional advantage of the inkjet printing system of the invention is that it can process wafers that do not have reference marks on their surface.

The invention also provides a method for inkjetting patterns of liquid material on wafers that are supplied in a high volume, the method including:

providing an inkjet system according to the invention; and repeating for the processing of each wafer the following steps:

picking up a wafer and placing a wafer on a said chuck;

controlling the associated camera of said chuck to take a single image that includes the wafer edge and the 2-dimensional visual reference of the chuck;

determining the position of the chuck relative to the camera by detecting the position of the 2-dimensional visual reference with respect to the camera pixel coordinates; and determining the position of the wafer relative to the camera by detecting the position of the wafer edge of the wafer with respect to the camera pixel coordinates;

using these two position determinations to calculate the wafer position relative to the 2-dimensional visual reference and thus relative to the chuck with an accuracy of less than the second threshold value and based on that relative position subsequently timing the firing of the at least one nozzle of the at least one printing head and controlling the movement of the printing motion assembly with a positioning variation of less than the first threshold value so that the liquid discharged by the inkjet printing head is positioned on the wafer with a positioning variation that is less than the sum of the first and the second threshold values.

With this method, the placement of liquid on wafers can be effected very accurately and precisely with a relatively low cost inkjet printing system. The inkjet printing system can be low cost because only a single simple CCD camera may be needed that takes an image of the associated chuck and the entire wafer placed on the chuck. After having taken the image, which is performed every instance after a new wafer has been placed on the chuck, calculations suffice to determine the position of the wafer relative to the printing head. This can be done very quickly. Because the length of the wafer edge and dimensions of the 2-dimensional visual reference may be substantial, typically in the order of centimeters, the number of pixels involved for determining the positions of the wafer edge and the 2-dimensional visual reference is large and, consequently, the accuracy of the determination of the relative positions of the 2-dimensional visual reference of the chuck and the wafer edges can be very good, even with a low cost camera. With a low cost camera the threshold value of the accuracy can be smaller than 50 micrometer but with a slightly improved CCD camera with a better CCD-sensor the accuracy can be improved dramatically and be typically smaller than 5 micrometer.

Next, various embodiments of the invention will be discussed with reference to an example that is shown in the drawings

DETAILED DESCRIPTION

Figure 1:
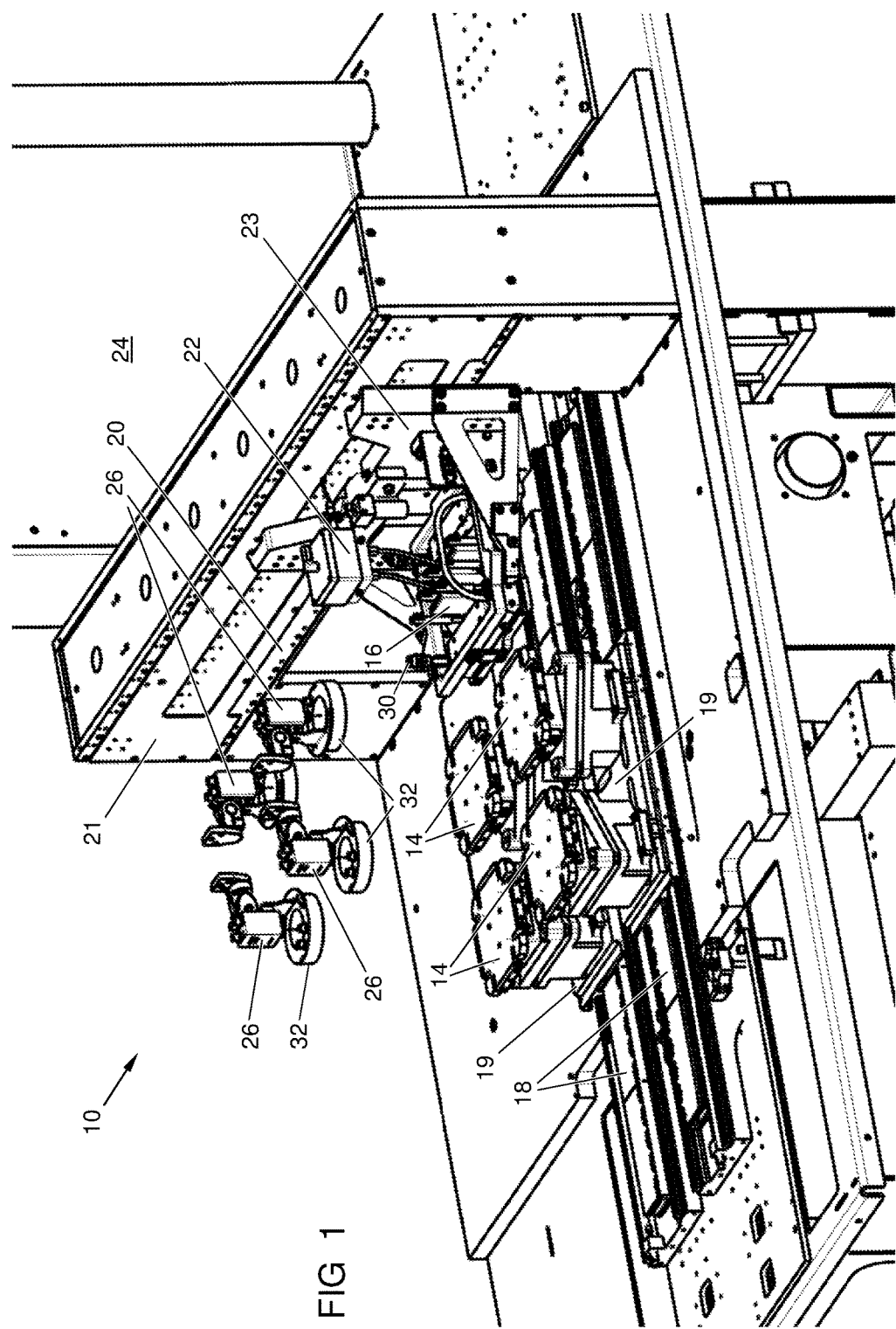
FIG. 1 shows a perspective view of an example of an inkjet printing system in which various embodiments of the invention are implemented.

The figures show an example of an inkjet printing system in which various embodiments of the invention are incorporated. It should be noted that the embodiments can also be applied independently and that the invention is not limited to the example which is shown in the figures. Below, various embodiments will be described, whereby reference numbers will be used to refer to the figures. The reference numbers are used herein for clarification but do not have a limiting effect. An embodiment may also be implemented in a different manner than the example shown in the drawing.

In the most general terms, the disclosure relates to an inkjet printing system 10 configured to inkjet patterns of liquid material on wafers W that are supplied in a high volume. An example of such an inkjet printing system 10 is shown in FIG. 1.

Each wafer W has a wafer edge $W_e$ that extends in at least two different directions. The system includes at least one chuck 14 on which a wafer W can be placed. This placement will be performed automatically by a wafer handling system, such as a wafer pick and place assembly that is configured to pick up wafers W that are supplied and to place the picked up wafers W on the at least one chuck 14 of the inkjet printing system 10. To that end, the wafer handling system may include at least one suction head that is configured to pick up a single wafer W. The wafer handling system may be a part of the inkjet printing system but that does not have to be the case. The wafer handling system may be supplied separately and be positioned adjacent the inkjet printing system for example next to or partly above the inkjet printing system.

The inkjet printing system 10 further comprises at least one inkjet printing head 16 that includes at least one nozzle wherein the at least one nozzle is configured to discharge liquid when the nozzle is fired by a control signal. The liquid that is discharged by the nozzle may take the form of a droplet or a continuous flow. The inkjet printing system also comprises a printing motion assembly 18, 20 that supports at least one of the at least one chuck 14 and the at least one inkjet printing head 16 so that a two dimensional printing area on the at least one chuck 14 can be covered with liquid discharged by the at least one printing head 16. In an embodiment, each inkjet printing head 16 includes a plurality of nozzles. In the example shown in FIG. 1, the printing motion assembly includes a first guides 18 extending in a Y-direction on which two tables 19 each with two chucks 14 are movable along the Y-direction. The inkjet printing system 10 shown in the example includes a portal 21 that extends over the first guide 18 transversally in an X-direction. The portal 21 includes a second guide 20 on which a carriage 23 is movable along the X-direction. The carriage 23 carries the at least one printing head 16. The combined movement in X- and Y-direction provides the possibility of covering a two dimensional area with liquid that is discharged by the at least one printing head 16. In an alternative embodiment, the chucks may be fixed and the portal 21 may be movable in the Y-direction. In yet another alternative embodiment the at least one printing head 16 may be fixed and the chucks 14 may be movable in both X- and Y-direction. The chucks 14 may also be rotatable around a Z-axis to align a main direction of the printing head with a main direction of a wafer edge or with a pattern or structure on the wafer. Alternatively or additionally, the at least one printing head 16 may be rotatably mounted around a Z-axis to align a main direction of the printing head 16 with a main direction of a wafer edge or with a pattern or structure on the wafer. The number of chucks 14 may be varied as well in various embodiments. An embodiment with one chuck 14, or, for that matter, with any number of chucks 14 is feasible as well.

The printing assembly includes an electronic controller assembly 22, 24 that is configured to produce control signals to the at least one nozzle and that is configured to control the printing motion assembly 18, 20 for positioning the at least one printing head 16 relative to the at least one chuck 14 so that the positioning variation with which the liquid is deposited relative to the chuck is less than a first threshold value. The positioning variation is a quantity of length expressed, for example, in the unit micrometers. It will be clear that the electronic controller assembly 22, 24 may include various electronic controller units that are in communication with one another. For example, the printing head 16 may have its own controller unit 22 producing the control signals for firing the nozzles. The printing motion assembly may have one or more electronic controller units, for example, one controller unit for each drive. A master controller 24 may communicate with the various drive controllers and the printing head controller 22 to coordinate the various drive controllers and the printing head controller 22.

Each chuck 14 of the at least one chuck 14 is associated with a single associated camera 26 that is directed to the associated chuck 14. Each camera 26 has a two dimensional matrix of camera pixels. This wording includes an embodiment in which a single camera 26 is associated with more than one chuck 14. Each pixel of a said camera 26 has a pixel coordinate. The camera or cameras 26 may be relatively simple and low cost CCD-cameras.

Figure 2:
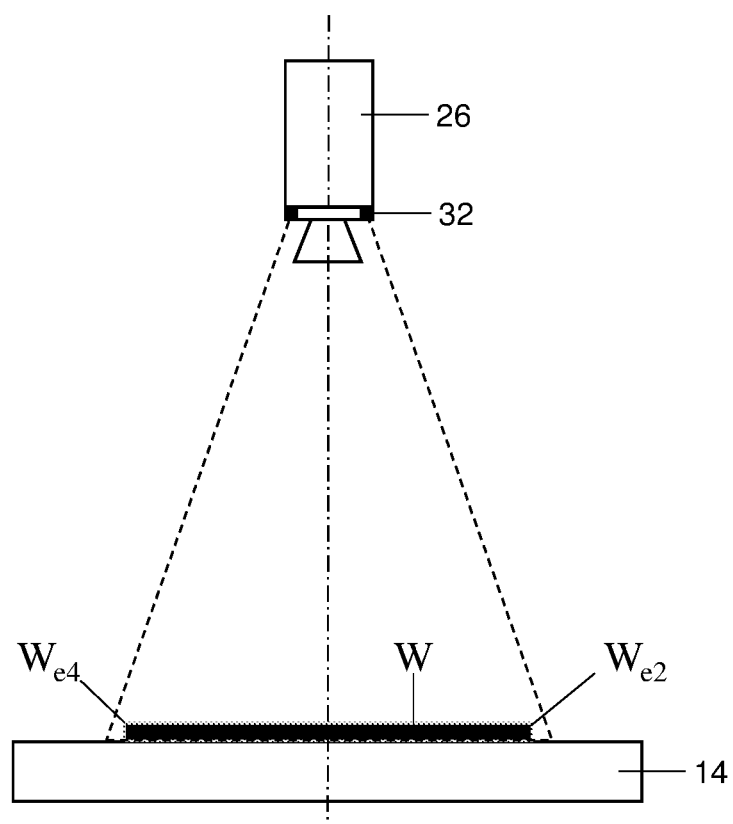
FIG. 2 shows a schematic elevation view of the a chuck with an associated camera.
Figure 3:
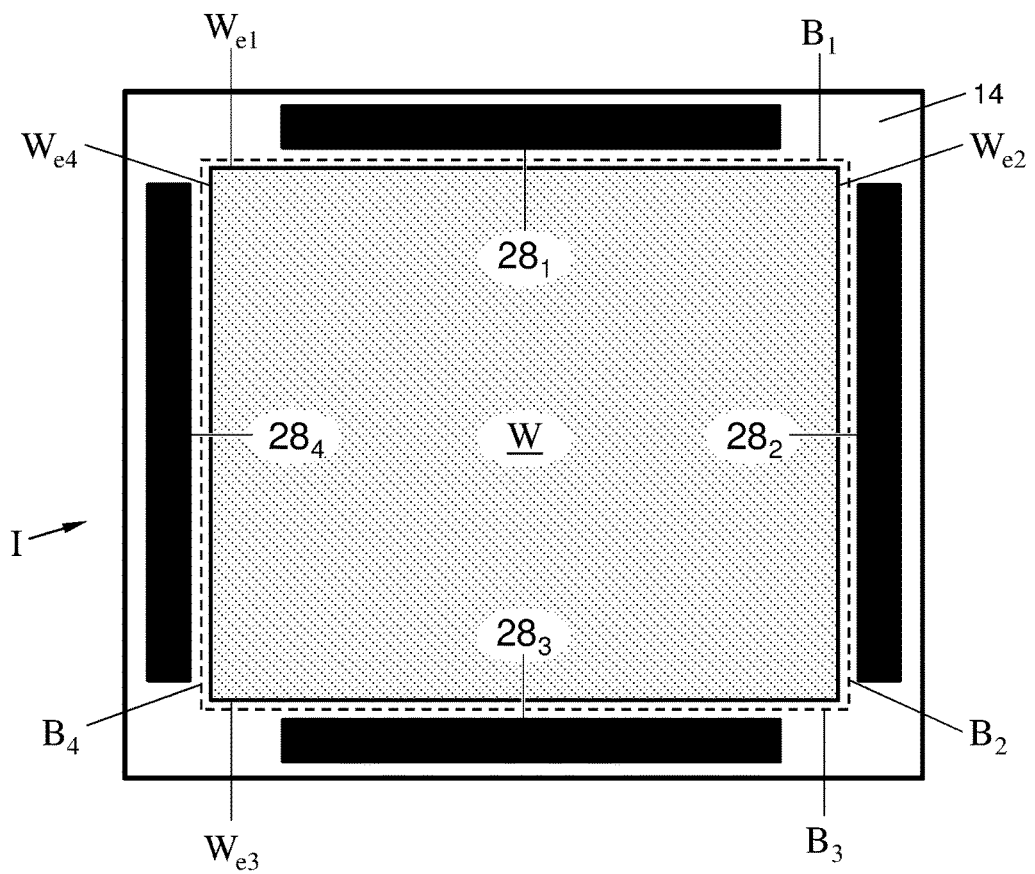
FIG. 3 shows an example of an image taken by a camera of the inkjet printing system.

FIG. 2 shows a schematic elevation view of a chuck 14 with an associated camera 26. The figure clearly shows that the camera 26 is positioned above the chuck 14 to take an image I of substantially the entire upper surface of the chuck 14 and the wafer W placed thereon. An example of such an image I is shown in FIG. 3.

In an alternative embodiment, a single camera 26 may be associated with more than one chuck 14, so that the camera may take an image of several chucks 14 with wafers W placed thereon.

Each chuck 14 includes a placement area extending within a boundary B. The boundary B may be a virtual boundary on a flat upper face of the chuck 14. In other words, each chuck 14 has a substantially flat upper surface on which a wafer W may be placed. Within the flat surface a specific area is designated to be the placement area. The placement area is bounded by a boundary B which may not be visible and may not be defined by any structural feature of the chuck 14. It may be just the virtual boundary B within which the wafers W must be placed by the wafer handling system.

Each chuck 14 includes a 2-dimensional visual reference 28. Preferably, the 2-dimensional visual reference 28 includes visual edges which extend in two directions and which are substantially parallel to the at least two directions of the wafer edge $W_e$ of a wafer W that is placed on the chuck 14.

In an embodiment, of which an example is shown in the figures, the 2-dimensional visual reference 28 may include four straight reference edges $28_1$, $28_2$, $28_3$, $28_4$ that delimit a rectangular placement area. In such embodiment the two directions of the 2-dimensional visual references are orthogonal relative to each other. In this embodiment, the wafers W will be rectangular as well.

In an alternative embodiment, the 2-dimensional visual reference may include a single circular visual reference edge 28. In this embodiment, the wafers W to be processed will be circular as well. A circular visual reference edge 28 as well as a circular wafer edge extend in an endless number of directions and the inkjet print system will be able to determine the eccentricity of the placement of a circular wafer W relative to the circular visual reference edge 28.

It will be clear that many variations of the 2-dimensional visual reference 28 and contours of the wafer edge $W_e$ are feasible. For example, combinations of circular or alternatively curved visual edges and straight edges are feasible for the 2-dimensional visual reference 28. Also other polygonal configurations than a rectangular configuration are feasible for the 2-dimensional visual reference 28. Similar variations are also feasible for the contour of the wafer edge $W_e$.

The controller assembly 22, 24 mentioned above is configured to control a said camera 26 that is associated with a said chuck 14 to take a single image I each instance a wafer has been placed on that chuck 14. The image I includes the wafer edge $W_e$ and the 2-dimensional visual reference 28 of the chuck 14. Additionally, the controller assembly 22, 24 is configured to determine, for each image I, the position of the chuck 14 relative to the camera 26 by detecting the position of the 2-dimensional visual reference 28 with respect to the camera pixel coordinates. The controller assembly is additionally configured to determine, for each image I, the position of the wafer W relative to the camera 26 by detecting the position of the wafer edge $W_e$ of the wafer W with respect to the camera pixel coordinates. On the basis of these two position determinations, the controller assembly is configured to calculate, for each image I, the wafer position relative to the 2-dimensional visual reference 28 and thus relative to the chuck 14 with an accuracy of less than a second threshold value. This accuracy is a quantity of length expressed in, for example, in the unit micrometers. Based on that relative position, the controller assembly is configured to subsequently time the firing of the at least one nozzle of the at least one printing head 16 and control the movement of the printing motion assembly 18, 20 so that the liquid discharged by the inkjet printing head 16 is positioned on the wafer W with a positioning variation which is less than the sum of the first and the second threshold values.

In an embodiment, of which an example is shown in the figures, the 2-dimensional reference 28 of the chuck 14 has a dimension which is in the same order as the dimensions of the placement area so that camera pixels which are positioned at remote parts of pixel matrix of the camera catch parts of the 2-dimensional reference when the image I is taken. In this embodiment the accuracy of the position determination of the 2-dimensional reference 28 relative to the camera is optimized.

In an embodiment, the first threshold value is 5 micrometer or less. With a printing motion assembly 18, 20 meeting this requirement, the inkjet printing system is able to print patterns on wafers with a repeatable precision. For example for the production of photovoltaic cells this first threshold value suffices to obtain good quality PV-cells.

In an embodiment, the second threshold value is 50 micrometer or less, more preferably 5 micrometer or less. Such an accuracy suffices for the production of photovoltaic cells on which the patterns of the guiding tracks are printed with an inkjet printing system as disclosed herein.

In an embodiment, of which an example is shown in the figures, the inkjet printing system 10 may be configured for processing rectangular wafers W having four wafer edge parts $W_{e1}$, $W_{e2}$, $W_{e3}$, $W_{e4}$. Two wafer edge parts $W_{e1}$, $W_{e3}$ are parallel and extend in a first direction and two other wafer edge parts $W_{e2}$, $W_{e4}$ are also parallel and extend in a second direction. The first and the second direction are substantially orthogonal. Each chuck 14 has at least one first 2-dimensional visual reference part embodied as two straight visual edges $28_1$, $28_3$ extending in a third direction and at least one second 2-dimensional visual reference part embodied as two straight visual reference edges $28_2$, $28_3$ extending in a fourth direction. The third and the fourth direction are orthogonal. When a wafer W has been placed on a said chuck 14, the first direction is substantially parallel to the third direction and the second direction is substantially parallel to the fourth direction. Rectangular wafers may, for example, be used for the production of photovoltaic cells manufactured from Si.

In a further elaboration of that embodiment, each chuck 14 may have four 2-dimensional visual reference parts embodied as straight visual reference edges $28_1$, $28_2$, $28_3$, $28_4$ that are collinear with associated boundary parts $B_1$, $B_2$, $B_3$, $B_4$ of the boundary B of the placement area. Preferably, the four visual reference edges $28_1$, $28_2$, $28_3$, $28_4$ extend along a major part of the length of the associated boundary parts $B_1$, $B_2$, $B_3$, $B_4$ of the placement area. The greater the length of the 2-dimensional visual reference parts $28_1$, $28_2$, $28_3$, $28_4$, the more camera pixels are involved in determining the position of the visual reference parts $28_1$, $28_2$, $28_3$, $28_4$ and the better the accuracy of that position determination is. In this embodiment, the four straight visual reference edges $28_1$, $28_2$, $28_3$, $28_4$ extend substantially parallel to and are adjacent to associated wafer edge parts $W_{e1}$, $W_{e2}$, $W_{e3}$, $W_{e4}$ when a wafer W is placed on a said chuck 14.

In an alternative embodiment, which is not shown in the figures, the wafers to be processed may circular and have a single wafer edge $W_e$. Each chuck may have a 2-dimensional visual reference 28 that is embodied as a circular visual reference edge. The diameter of the circular visual reference edge 28 will, in that embodiment, be slightly larger than the diameter of the wafers W to be processed. The boundary B of the placement area is circular and coincides with the circular visual reference edge 28. Such an inkjet printing system is configured to process circular wafers. Circular wafers are, for example, used in the production of chips and LEDs or MEMS.

It should be noted that circular wafers W may be processed on an embodiment of the inkjet system in which the 2-dimensional visual reference 28 includes straight visual reference edges, for example as shown in the example, four orthogonal straight visual reference edges $28_1$, $28_2$, $28_3$, $28_4$. Alternatively, rectangular wafers W can also be processed in an embodiment of the inkjet printing system in which the 2-dimensional visual reference 28 includes a circular visual reference edge.

In an embodiment, of which an example is shown in FIG. 1, each inkjet printing head 16 may be associated with a calibration camera 30 that is fixedly connected to the associated inkjet printing head 16. The calibration camera 30 may be configured to measure the position of an amount of liquid that is discharged by the associated inkjet printing head 16 on one of the at least one chucks 14 or on a wafer W that is positioned on that chuck 14. The measurement of the position of the amount of liquid is effected relative to the chuck 14 so as to determine the position of the inkjet printing head 16 relative to the chuck 14 for the purpose of calibration of the system. Such a calibration may be performed after maintenance of the system or after having processed a large number of wafers W, wherein the measurement of the position with the calibration camera has an accuracy which is less than a third threshold value. This accuracy is a quantity of length, for example, expressed in the unit of micrometers. In an embodiment, the third threshold value may be 5 micrometer or less. It is explicitly not intended that the calibration takes place after each and every wafer W that has been processed by the inkjet printing system 10. The amount of liquid may, for example, be one or more liquid droplets or a continuous flow of liquid to form a track of liquid on the chuck 14 or wafer W.

Such a calibration camera 30 is advantageous for determining the position of a printing head 16 of the system relative to a chuck 14 of the system very precisely. Because this calibration only has to be performed once in a while, for example, after maintenance of the printing head 16 or after having processed several thousands of wafers W, it has virtually no bearing on the production capacity of the inkjet printing system.

In an embodiment, of which an example is shown in the figures, each camera 26 may have an associated ring light source 32 that has a central axis L that is collinear with a camera axis L of the associated camera 26. The ring light source 32 directs light to the associated chuck 14.

The ring camera 26 sheds light on the chuck 14 with the wafer W in a uniform manner without unwanted shadows. This is beneficial for the quality of the image I that is taken by the camera 26 that is associated with the ring camera 26.

The invention also provides a method for inkjetting patterns of liquid material on wafers W that are supplied in a high volume. The method includes:
  providing an inkjet system 10 according to any one of claims 1-6;
and repeating for the processing of each wafer W the following steps:
  picking up a wafer W and placing a wafer on a said chuck 14;
  controlling the associated camera 26 of said chuck 14 to take a single image I that includes the wafer edge $W_e$ and the 2-dimensional visual reference 28 of the chuck 14;
  determining the position of the chuck 14 relative to the camera 26 by detecting the position of the 2-dimensional visual reference 28 with respect to the camera pixel coordinates; and
  determining the position of the wafer W relative to the camera 26 by detecting the position of the wafer edge $W_e$ of the wafer W with respect to the camera pixel coordinates;
  using these two position determinations to calculate the wafer position relative to the reference edge 28 and thus relative to the chuck 14 with an accuracy of less than the second threshold value and based on that relative position subsequently timing the firing of the at least one nozzle of the at least one printing head 16 and controlling the movement of the printing motion assembly 18, 20 with a positioning variation of less than the first threshold value so that the liquid discharged by the inkjet printing head 16 is positioned on the wafer W with a positioning variation which is less than the sum of the first and the second threshold values.

As explained above, the method can be performed with a relatively low cost inkjet printing system. A high throughput of wafers may be obtained. Per chuck 14, the wafer production for photovoltaic cells may be typically at least four wafers per chuck per minute. With the example shown in FIG. 1, i.e. an embodiment having four chucks 14, the production capacity may be 4*5*60=1200 wafers per hour.

In an embodiment, the first threshold value is 5 micrometer or less and the second threshold value is 50 micrometer or less, preferably 5 micrometer or less. With such thresholds, for example, the tracks on PV-cells can be printed with sufficient precision to obtain good quality PV-cells. For other applications of the inkjet printing system 10 other threshold values may be feasible.

In an embodiment, wherein the inkjet printing system 10 includes a calibration camera 26 that is fixedly connected to the associated inkjet printing head 16, the method may include a calibration operation which is performed after maintenance of the system or after having processed a large number of wafers. Such calibration operation may include:
  determining a said inkjet printing head 16 and a said chuck 14 of which the relative position have to be calibrated;
  positioning the inkjet printing head 16 above the chuck 14 of which the relative position has to be calibrated;
  discharging an amount of liquid from the inkjet printing head 16 on the chuck 14 or on a wafer placed W on that chuck 14;
  activating the calibration camera 30 that is fixedly connected to the inkjet printing head 16
  performing a measurement with the calibration camera 30 to determine with an accuracy of less than the third threshold value the position of the amount of liquid that is discharged by the associated inkjet printing head 16 relative to the chuck 14, more particular relative to 2-dimensional reference 28 of the chuck 14; and
  on the basis of that measurement determining the position of the inkjet printing head 16 relative to the chuck 14 for the purpose of calibration.

In an embodiment, the third threshold value may be 5 micrometer or less. By virtue of the presence of a calibration camera, it is ensured that the inkjet printing system 10 remains accurate and precise even if the at least one printing head as been removed for maintenance or when several thousands of wafers W have been processed.

The various embodiments which are described above may be implemented independently from one another and may be combined with one another in various ways. The reference numbers used in the detailed description and the claims do not limit the description of the embodiments nor the claims and are solely used to clarify.

The invention claimed is:

1. An inkjet printing system configured to inkjet patterns of liquid material on wafers that are supplied in a high volume and that each have a wafer edge that extends in at least two different directions, the inkjet printing system including:
  at least one chuck on which a wafer can be placed;
  at least one inkjet printing head that includes at least one nozzle that is configured to discharge liquid when the nozzle is fired by a control signal;
  a printing motion assembly that supports at least one of the at least one chuck and the at least one inkjet printing head so that a two dimensional printing area on the at least one chuck can be covered with liquid discharged by the at least one printing head;
  an electronic controller assembly configured to produce control signals to fire the at least one nozzle and configured to control the printing motion assembly for positioning the at least one printing head relative to the at least one chuck so that the positioning variation with which the liquid is deposited relative to the chuck is less than a first threshold value;

each chuck of the at least one chuck being associated with a single associated camera that is directed to the associated chuck, each camera having a two dimensional matrix of camera pixels, each pixel having a pixel coordinate;

each chuck including a placement area extending within a boundary;

each chuck including a 2-dimensional visual reference provided directly on each chuck, within a periphery of each chuck and outside of the boundary;

wherein the controller assembly is configured:
to control a said camera that is associated with a said chuck to take a single image each instance a wafer has been placed on that chuck, wherein the image includes the wafer edge and the 2-dimensional visual reference of the chuck;
to determine from each said single image:
the position of the chuck relative to the camera by detecting the position of the 2-dimensional visual reference with respect to the camera pixel coordinates; and
the position of the wafer relative to the camera by detecting the position of the wafer edge of the wafer with respect to the camera pixel coordinates;
to use these two position determinations to calculate, for each said single image, the wafer position relative to the 2-dimensional visual reference and thus relative to the chuck with an accuracy of less than a second threshold value and, based on that relative position, subsequently time the firing of the at least one nozzle of the at least one printing head and control the movement of the printing motion assembly so that the liquid discharged by the inkjet printing head is positioned on the wafer with a positioning variation which is less than the sum of the first and the second threshold values, and
wherein each camera has an associated ring light source that has a central axis that is collinear with a camera axis of the associated camera, wherein the ring light source directs light to the associated chuck.

2. The inkjet printing system according to claim 1, wherein the 2-dimensional reference of the chuck has a dimension which is in the same order as the dimensions of the placement area so that camera pixels which are positioned at remote parts of pixel matrix of the camera catch parts of the 2-dimensional reference when the image is taken.

3. The inkjet printing system according to claim 2, wherein the first threshold value is 5 micrometer or less.

4. The inkjet printing system according to claim 2, wherein the second threshold value is 50 micrometer or less.

5. The inkjet printing system according to claim 1, wherein the first threshold value is 5 micrometer or less.

6. The inkjet printing system according to claim 1, wherein the second threshold value is 50 micrometer or less.

7. The inkjet printing system according to claim 1, wherein the system is configured for processing rectangular wafers having four wafer edge parts of which two wafer edge parts are parallel and extend in a first direction and of which two other wafer edge parts are parallel and extend in a second direction, wherein the first and the second direction are substantially orthogonal, wherein each chuck has at least one first 2-dimensional visual reference part embodied as two straight visual edges extending in a third direction and at least one second 2-dimensional visual reference part embodied as two straight visual edges extending in a fourth direction, wherein the third and the fourth direction are orthogonal, and wherein, when a wafer has been placed on a said chuck, the first direction is substantially parallel to the third direction and the second direction is substantially parallel to the fourth direction.

8. The inkjet printing system according to claim 7, wherein each chuck has four 2-dimensional visual reference parts embodied as straight visual edges that are collinear with associated boundary parts of the boundary of the placement area and that extend substantially parallel to and are adjacent to associated wafer edge parts when a wafer is placed on a said chuck.

9. The inkjet printing system according to claim 1, wherein the wafers to be processed are circular and have a single wafer edge.

10. The inkjet printing system according to claim 9, wherein the 2-dimensional visual reference is embodied as a circular visual reference edge, wherein the diameter of the circular visual reference edge is slightly larger than the diameter of the wafers to be processed and wherein the boundary of the placement area is circular and coincides with the circular visual reference edge.

11. The inkjet printing system according to claim 1, wherein each inkjet printing head is associated with a calibration camera that is fixedly connected to the associated inkjet printing head and that is configured to measure the position of an amount of liquid that is discharged by the associated inkjet printing head on one of the at least one chucks or on a wafer that is positioned on that chuck, wherein the measurement of the position of the amount of liquid is effected relative to the chuck so as to determine the position of the inkjet printing head relative to the chuck for the purpose of calibration of the system to be performed after maintenance of the system or after having processed a large number of wafers, wherein the measurement of the position with the calibration camera has an accuracy which is less than a third threshold value.

12. The inkjet printing system according to claim 11, wherein the third threshold value is 5 micrometer or less.

13. The inkjet printing system according to claim 1, wherein the second threshold value is 5 micrometer or less.

14. A method for inkjetting patterns of liquid material on wafers that are supplied in a high volume, the method including:
providing the inkjet system according to claim 1; and
repeating a process for each wafer, the process comprising;
picking up a wafer and placing the wafer on a chuck;
controlling the associated camera of said chuck to take a single image that includes the wafter edge and the 2-dimensional visual reference of the chuck;
determining the position of the chuck relative to the associated camera of the chuck by detecting the position of the 2-dimensional visual reference with respect to the camera pixel coordinates;
determining the position of the wafer relative to the associated camera of the chuck by detecting the position of the wafer edge of the wafer with respect to the camera pixel coordinates; and
using these two position determinations to calculate the wafter position relative to the 2-dimensional visual reference and thus relative to the chuck with an accuracy of less than the second threshold value and based on that relative position subsequently timing the firing of the at least one nozzle of the at least one printing head and controlling the movement of the printing motion assembly with a positioning variation of less than the first threshold value so that the liquid discharged by the inkjet printing head is positioned on the wafer with a positioning variation which is less than the sum of the first and the second threshold values.

15. The method according to claim 14, wherein the first threshold value is 5 micrometer or less and wherein the second threshold value is 50 micrometer or less.

16. The method according to claim 14, wherein each inkjet printing head is associated with a calibration camera that is fixedly connected to an associated inkjet printing head and that is configured to measure the position of an amount of liquid that is discharged by the associated inkjet printing head on one of the at least one chucks or on a wafer that is positioned on the chuck, wherein the measurement of the position of the amount of liquid is effected relative to the chuck so as to determine the position of the associated inkjet printing head relative to the chuck for the purpose of calibration of the system, wherein the measurement of the position with the calibration camera has an accuracy which is less than a third threshold value, and wherein the method includes a calibration operation, wherein the calibration operation includes:

determining the associated inkjet printing head and the chuck of which the relative position have to be calibrated;

postioning the associated inkjet printing head above the chuck of which the relative position has to be calibrated;

discharging an amount of liquid from the associated inkjet printing head on the chuck or on a wafer placed on that chuck;

activating the calibration camera that is fixedly connected to the inkjet printing head;

performing a measurement with the calibration camera to determine with an accuracy of less than the third threshold value the position of the amount of liquid that is discharged by the associated inkjet printing head relative to the chuck, more particular relative to the 2-dimensional visual reference of the chuck; and on the basis of that measurement, determining the position of the inkjet printing head relative to the chuck for the purpose of calibration.

17. The method according to claim 16, wherein the third threshold value is 5 micrometer or less.

18. The method of claim 16, wherein the amount of liquid that is discharged to perform a measurement on with the calibration camera is at least one liquid droplet or at least one liquid track.

19. The method according to claim 14, wherein the first threshold value is 5 micrometer or less and wherein the second threshold value is 5 micrometer or less.

* * * * *